(12) United States Patent
deVilliers et al.

(10) Patent No.: US 9,646,898 B2
(45) Date of Patent: May 9, 2017

(54) METHODS FOR TREATING A SUBSTRATE BY OPTICAL PROJECTION OF A CORRECTION PATTERN BASED ON A DETECTED SPATIAL HEAT SIGNATURE OF THE SUBSTRATE

(71) Applicant: Tokyo Electron Limited, Minato-ku, Tokyo (JP)

(72) Inventors: Anton J. deVilliers, Clifton Park, NY (US); Daniel Fulford, Meridian, ID (US); Gerrit J. Leusink, Rexford, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/554,358

(22) Filed: Nov. 26, 2014

(65) Prior Publication Data
US 2015/0147827 A1    May 28, 2015

Related U.S. Application Data

(60) Provisional application No. 61/909,714, filed on Nov. 27, 2013, provisional application No. 61/932,005, filed on Jan. 27, 2014.

(51) Int. Cl.
*H01L 21/66*    (2006.01)
*H01L 21/67*    (2006.01)
(Continued)

(52) U.S. Cl.
CPC .............. *H01L 22/20* (2013.01); *G03F 7/168* (2013.01); *G03F 7/40* (2013.01); *G03F 7/70991* (2013.01);
(Continued)

(58) Field of Classification Search
CPC ................................................. G03F 7/70875
See application file for complete search history.

(56) References Cited

U.S. PATENT DOCUMENTS 5,580,471 A * 12/1996 Fukumoto ............ B23K 26/032
                                                      219/121.61
6,377,334 B2 * 4/2002 Whiting .................... G03F 7/38
                                                       250/492.2
(Continued)

FOREIGN PATENT DOCUMENTS

EP    1603153    2/2004
EP    1753017    4/2005

OTHER PUBLICATIONS

International Patent Application No. PCT/US2014/067565, "International Search Report and Written Opinion," mailed Mar. 3, 2015, Internatinal filing date Nov. 26, 2014.
(Continued)

*Primary Examiner* — Marc Armand
*Assistant Examiner* — Younes Boulghassoul

(57) ABSTRACT

Techniques herein include systems and methods that provide a spatially-controlled or pixel-based projection of light onto a substrate to tune various substrate properties. A given pixel-based image projected on to a substrate surface can be based on a substrate signature. The substrate signature can spatially represent non-uniformities across the surface of the substrate. Such non-uniformities can include energy, heat, critical dimensions, photolithographic exposure dosages, etc. Such pixel-based light projection can be used to tune various properties of substrates, including tuning of critical dimensions, heating uniformity, evaporative cooling, and generation of photo-sensitive agents. Combining such pixel-based light projection with photolithographic patterning processes and/or heating processes improves processing uniformity and decreases defectivity. Embodiments can
(Continued)

include using a digital light processing (DLP) chip, grating light valve (GLV), or other grid-based micro projection technology.

10 Claims, 4 Drawing Sheets

(51) Int. Cl.
  *G03F 7/20* (2006.01)
  *H01L 21/027* (2006.01)
  *G03F 7/40* (2006.01)
  *G03F 7/16* (2006.01)
(52) U.S. Cl.
  CPC ...... *H01L 21/027* (2013.01); *H01L 21/67248* (2013.01); *H01L 21/67253* (2013.01)

(56) References Cited

U.S. PATENT DOCUMENTS

| | | |
|---|---|---|
| 6,479,820 B1 | 11/2002 | Singh et al. |
| 6,573,480 B1 | 6/2003 | Rangarajan et al. |
| 7,095,484 B1 * | 8/2006 | Fries ................... G03F 7/70291 355/53 |
| 9,134,229 B2 * | 9/2015 | Lesage ................. A61B 5/0073 |
| 9,198,578 B2 * | 12/2015 | Zuzak .................. A61B 5/0071 |
| 2002/0113056 A1 * | 8/2002 | Sugaya ............. H01L 21/67248 219/444.1 |
| 2002/0177094 A1 | 11/2002 | Shirakawa |
| 2005/0213067 A1 * | 9/2005 | Van Der Feltz .... G03F 7/70875 355/67 |
| 2006/0132746 A1 * | 6/2006 | Baselmans et al. G03F 7/70291 355/67 |
| 2007/0082280 A1 * | 4/2007 | Menchtchikov .... G03F 7/70341 430/30 |
| 2008/0318806 A1 | 12/2008 | Gao et al. |
| 2009/0275149 A1 * | 11/2009 | Michaelson ............ H01L 22/20 438/5 |
| 2010/0002355 A1 | 1/2010 | Morooka |
| 2010/0227063 A1 | 9/2010 | Amro et al. |
| 2011/0018167 A1 | 1/2011 | Koole et al. |
| 2012/0015305 A1 * | 1/2012 | Garner ................. B01J 19/0046 430/319 |

OTHER PUBLICATIONS

Taiwanese Patent Application No. 103141239, "Notification of Examination Opinions," filing date Nov. 27, 2014, Notification of Examination Opinions dated Jul. 25, 2016.

* cited by examiner

METHODS FOR TREATING A SUBSTRATE BY OPTICAL PROJECTION OF A CORRECTION PATTERN BASED ON A DETECTED SPATIAL HEAT SIGNATURE OF THE SUBSTRATE

CROSS REFERENCE TO RELATED APPLICATIONS

The present application claims the benefit of U.S. Provisional Patent Application No. 61/909,714, filed on Nov. 27, 2013, entitled "Optical Projection Tuned Hot Plate," which is incorporated herein by reference in its entirety. The present application also claims the benefit of U.S. Provisional Patent Application No. 61/932,005, filed on Jan. 27, 2014, entitled "System and Method for Shifting Critical Dimensions of Patterned Films," which is incorporated herein by reference in its entirety.

BACKGROUND OF THE INVENTION

This disclosure relates generally to patterning of substrates including semiconductor substrates such as silicon wafers. This disclosure also relates to processes involved with photolithography including coating and developing films on substrates as part of semiconductor device fabrication. This disclosure particularly relates to controlling dimensions and accuracy of patterned features as part of photolithography and patterning processes.

Photolithography involves coating substrates with films that are sensitive to electromagnetic (EM) radiation, exposing these films to a pattern of a EM radiation to define a latent pattern within the film, and then developing away some of the film to reveal a physical or relief pattern on the substrate. Preparation and development of such films can include thermal treatment or baking. For example, a newly applied film can require a post-application bake (PAB) to evaporate solvents and/or to increase structural rigidity or etch resistance. Also, a post-exposure bake (PEB) can be executed to set a given pattern to prevent further dissolving. Fabrication tools for coating and developing substrate typically include many modules that can be used to add film, add resist, and develop a substrate.

SUMMARY

Semiconductor fabrication processes often specify precise temperature tolerances for systems used to heat treated substrates. Such systems are typically constructed as a hotplate within a processing chamber. Typical hotplates can include one or more heating elements or zones to uniformly heat a substrate positioned thereon. Such hotplates and conventional systems can heat substrates to a temperature uniformity within about 0.1 degrees Celsius across a surface of the substrate. For example a specific temperature can be maintained within 0.1 degrees Celsius to strengthen a resist structure prior to etching. Unfortunately, having a tolerance or temperature fluctuation of 0.1° C. can be insufficient to prevent defects in semiconductor fabrication processes. As semiconductor devices continue to scale down to smaller sizes, preventing defects becomes increasingly more important.

Techniques disclosed herein, however, can provide temperature uniformity to within about 0.02 degrees Celsius. Such an increase in temperature uniformity reduces defectivity and enables continued scaling of semiconductor devices.

Techniques herein include systems and methods that provide a spatially-controlled projection of light or electromagnetic (EM) radiation onto a substrate. Combining such spatial light projection with hot plate heating can achieve significant improvements in temperature uniformity across a surface of a substrate. A wavelength of 400-700 nm light, Ultra Violet Light (UV), infrared light, or any wavelength directed at an object can produce heat on the impact site of projected light. As total energy increases at a specific point on a substrate, a temperature of that point will increase until it reaches a steady state value. The steady state temperature on a substrate can be varied and controlled using different intensities and wavelengths within the range of a light source, such as a lamp. A given projected image can comprise multiple intensities and various wavelengths, which can be set to change and maintain many different steady state conditions on multiple substrates simultaneously. In other words, a substrate holder heat source in combination with a projected light image of a particular spatial heat signature can increase temperature uniformity across the surface of a substrate.

In one embodiment a camera/detector and a projector are directed at a substrate. The projector illuminates the substrate with light (at least a portion is illuminated), which can be based on a heat signature detected from an infrared detecting camera. The substrate can then have a modulated temperature with high spatial resolution with any number of light patterns and intensities. With the camera (or sensory array/sensor mechanism) detecting a heat signature, a corresponding pixelated image can be projected onto a substrate surface to modify surface temperature. Thus, a heat signature can be controlled by pixel, that is, controlled by spot or grid point location on the substrate surface. The projected image can be tailored to specific results desired. For example, if temperature uniformity is desired, then the projected image can be an inverse of the heat signature to essentially heat cold areas and/or cool or maintain warm areas. Thus, a combination of fine and coarse control for a hotplate can provide significantly better uniformity. Because light is heat, areas that need spatial temperature adjustment can be irradiated with an amount of light. Because light can alter material properties of certain materials (such as photoresists), existing exposures can be augmented to be biases up or down. Thus, an additional embodiment includes tuning film properties using a pixel-based projected light pattern.

Such systems and methods enable semiconductor manufacturers to meet design demands. Design specifications for semiconductor manufacturing limit the process of developing and producing semiconductors by forcing a set of parameters onto the engineer that current technology cannot avoid. One of these design specifications is related to the baking step of semiconductor production. When a substrate is baked it is baked uniformly at a particular temperature and for an amount of time. Being able to replace the constant of uniform temperature with variable temperature gives a process controller more flexibility and increases efficiency of semiconductor production.

Note that this disclosure is not limited to thermal processing in photolithography. This disclosure also addresses techniques for spatially altering substrate temperature and can be applicable to vacuum and non-vacuum processing systems in semiconductor, flat panel display, and photovoltaic systems including deposition systems, etching systems (wet and dry). For example, pixel-based projected light patterns can correct critical dimensions, lithographic exposure non-uniformities, stepper exposure lag time, and so forth.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Figure 1:
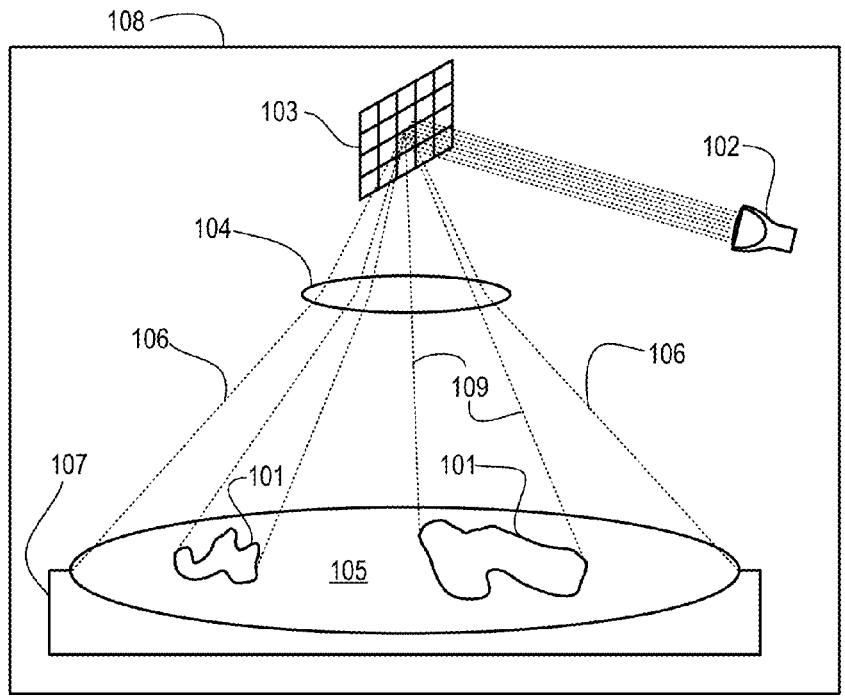
FIG. 1 is a schematic perspective illustration of an example image projection system for tuning a substrate.

Techniques herein include systems and methods that provide a spatially-controlled or pixel-based projection of light onto a substrate to tune various substrate properties. Such pixel-based light projection can be used to tune various properties of substrates, including tuning of critical dimensions, heating uniformity, evaporative cooling, photolithographic flare, raster delay, and generation of photo-sensitive agents. Combining such pixel-based light projection with contact-based heating (for example, a hotplate) can achieve significant improvements in temperature uniformity across a surface of a substrate. Combining such pixel-based light projection with photolithographic patterning processes can improve processing uniformity and decrease defectivity.

In one embodiment, a digital light processing (DLP) chip, grating light valve (GLV), or other grid-based micro projection technology, coupled with a light source can focus an image (optionally using a lens) onto a substrate and correct or adjust temperature and other non-uniformities. The projected image can be changed to vary the temperature output of the focused image. For example a solid white image with a visible spectrum bulb projected onto the plate will heat the plate to a given maximum temperature for that particular bulb. A temperature per projected pixel can be adjusted by using all, none, or some of the wavelengths of light produced by that light source. Such a technique gives extremely precise control over a given baking process of semiconductors, sufficient to bake semiconductors to within 1 nm. A DLP chip can project an image onto a substrate and change the amount of heat at any specific point or points on the substrate. Note that adjusting spatial temperature non-uniformity can function for either heating or cooling a substrate. For example, if a substrate is being cooled, a projected light image can assist with uniform cooling by slightly warming spots that are cooling too rapidly in comparison to other spots on a substrate being cooled.

Conventional bake plates can only maintain accuracy to 0.1 degrees Celsius, which can be due in part to the critical dimensions of the substrate. Typical hotplates can have heating zones but the size of these zones is several orders of magnitude larger than an area on a substrate that needs temperature adjustment. Thus, conventionally, heat needed on each individual area cannot be adjusted to desired specifications. A projected image as disclosed herein, however, can vary heat output to every individual atom depending on a number of pixels supported by a selected DLP and the incident area. That is, heat control available from using micro-mirror projection can be as flexible or fine-tuned as a its maximum projected resolution. In one embodiment, a pixel-based light projection system is connected to a control computer of a baking device, exposure chamber, dispense chamber, hotplate, etc. The pixel-based light projection system can be focused through a lens system into an exposure chamber where a substrate is aligned. Light projected onto or at the substrate then heats or adjusts desired areas of the substrate to a desired temperature. There are several uses of such a method and system. One application is to maintain temperature uniformity. Another application is to reduce the critical dimensions requirement of the baking process of semiconductor manufacturing.

FIG. 1 illustrates an example embodiment of an optical projection tuned hot plate. Processing chamber 108 can be sized for receiving a substrate, such as a silicon wafer, flat panel, etc. Processing chamber 108 can be a relatively minimum size (based on a size of the substrate) for maximum heat retention and for protection from hazardous light wavelengths. A substrate alignment system 107 can be used to align an image onto a workable area on the substrate, which can be within 0.1 nanometers. Substrate 105 can be positioned on a substrate holder and/or hotplate. Substrate 105 can be a conventional reflective or non-reflective silicon disk with any type of coating.

The system includes light source 102 that can be located within, adjacent to, or remote from the processing chamber 108. Light source 102 can be any of several light sources such as visible light source, infrared light source, UV light source, or bulbs producing other wavelengths of light. Light source characteristics can be tailored to (or selected for) a particular substrate being treated and a particular tuning application. For some substrates, a 60 Watt (or equivalent) source may be sufficient, with a wavelength range of 400-700 nm, and a DLP resolution of 1080p (1080 horizontal lines of vertical resolution and progressive scan). Other applications may require higher power and higher resolution. The light source can be selected based on particular wavelength(s) desired. For example an ultraviolet light source can be selected for certain applications, while a white or infrared source can be selected for other applications. Light source selection can be based on the absorption characteristics of a particular substrate and/or film. Any resolution can be used that is supported by DLP, GLV, or other light valve technologies.

Light projection device 103 can be embodied as a DLP chip, Grating light valve (GLV) or other light valve technology. DLP chips and GLVs are conventionally available. Lens system 104 can be used to produce an image, with minimal aberrations, the size of the substrate 105 as projected onto the substrate 105. Projection lines 106 represent an image field or video being projected toward substrate 105. This video or image can be designed based on expected heat output and or dynamic feedback from a spatial temperature sensor, such as an infrared camera. A given image can be input from a video processor to a DLP. Items 101 show example locations on substrate 105 (being heated) that have temperatures different from other portions of the substrate. Projected image 109 projects light in the shape of one of items 101. If item 101 happens to be at a lower temperature than the remaining surface area of the substrate 105, then projected image 109 can increase local surface temperature to make a uniform temperature across the entire substrate 105.

Such a system herein thus combines a fine and coarse control system for hotplate temperature control—the hotplate corresponding to (comparatively) coarse control and the light projection system corresponding to (comparatively) fine control. Conventional temperature control is thus augmented with location-based high-resolution capability from a DLP control loop. Heat energy is transferred to the hotplate surface by projecting light on the substrate surface. Every location that a projected pixel can be turned on or off thus becomes an area that can have fine tuning for heat, temperature, CD correction, and photo reactivity.

For example, embodiments wherein image projection is used to create a uniform temperature, a heat signature of a chuck (substrate holder) and/or substrate can be identified for more accurate correction. An expected value of a substrate at equilibrium should be 0.00X° C. at every point on the substrate. Any deviation from 0.00X° C. is then a current heat signature of the substrate. When a substrate is placed on a hot plate, the hot plate is not uniform at 0.00X° C. and creates a deviation from the desired equilibrium creating the heat signature. Conventional hotplates can create a substrate surface temperature that has a 0.1 degree Celsius spatial deviation.

Techniques herein, when applied to substrate heating applications, can increase temperature uniformity. Heat output from a given projected image depends on its intensity, pattern, and/or color. For example, a point location with no light projection will have 0% heat increase, a space receiving a grey light can have a 50% relative heat increase, while areas with full light projection result in 100% increase of possible heat available.

Figure 5:
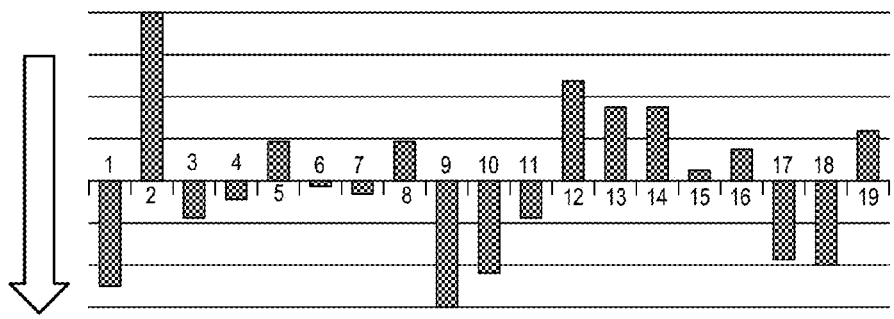
FIG. 5 is a diagram of an example simplified heat signature across a substrate cross section.

FIG. 5 is a graph illustrating a simplified example heat signature for a given substrate. This can be a heat signature across a cross-section of a substrate. In this example heat signature, there are 19 point locations for measuring relative heat. The top of this graph represents relatively colder temperatures, which temperatures increase moving down in the graph such that the bottom of the graph indicates relatively warmer temperatures. For example, point location 1 is a relatively hot spot, while point location 2 is relatively cold, with points 3 and 4 being moderately warm. Note that there is a temperature variation across the substrate, which variation of temperature by planar location is one embodiment of a heat signature.

Figure 6:
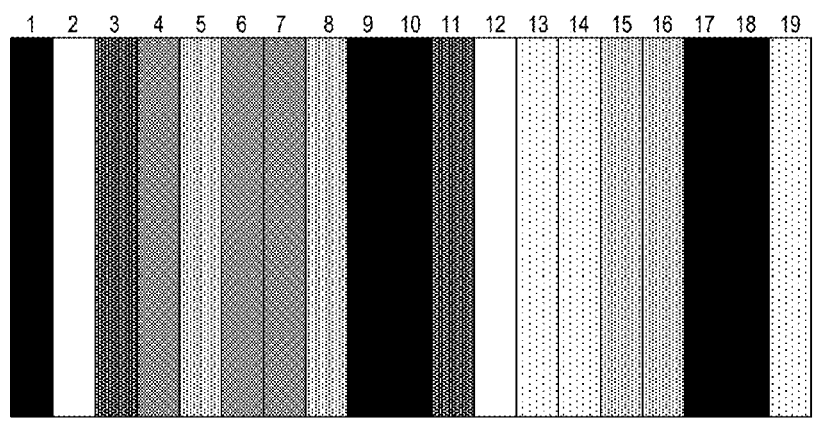
FIG. 6 is a diagram representing a projection image compensating for a given heat signature.
Figure 7:
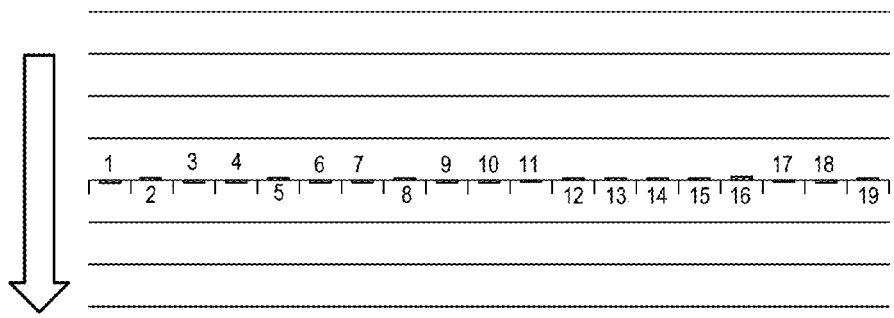
FIG. 7 is a diagram of an example simplified heat signature across a substrate cross section.

FIG. 6 is a diagram representing a projected image to correct heat variation from the heat signature represented in FIG. 5. In other words, the projected image compensates for the heat signature with temperature fluctuations. For example, note that points 1, 9, 10, 17, and 18 from the heat signature in FIG. 5 are relatively hot spots. Notice that the projected image in FIG. 6 has no light projected at these locations, which causes no heat increase. Point locations 2 and 12 from the heat signature in FIG. 5 are relatively cold, and so in the image projection in FIG. 6, these point locations are shown as white representing full light exposure to cause a maximum of heat increase (maximum temperature change possible based on intensity of a corresponding light source). Other point locations are illustrated with varying shades of grey representing moderate fluctuations in temperature are similarly corrected with light variable light projection. FIG. 7 shows a modified heat signature which is a result from the projected image in FIG. 6 applied to the heat signature of FIG. 5. Note that compared to the heat signature from FIG. 5, most temperatures have been modified so that there is substantially less temperature variation.

Figure 3:
FIG. 3 is an illustration representing an example substrate signature of a property that varies spatially.

The substrate signature illustrated in FIG. 5 is a simplified, linear signature. Substrates are typically planar and thus uniformity fluctuations can vary based on planar or X, Y, location on a substrate. FIG. 3 is an illustration depicting an example critical dimension signature. This critical dimension signature is mapped as point locations on the surface of a given substrate such as a wafer used in microfabrication processes. Note that various points on the CD signature illustration vary in degree of darkness or lightness. These relative differences at point locations on the CD signature illustration represent relative differences in CD uniformity. For example, point locations that are completely darkened can represent areas having CDs that are too small, whereas point locations that are completely lightened or lighter can represent areas having CDs that are too large. This CD signature can be generated based on observed and/or measured dimensions.

This substrate signature illustration in FIG. 3 can also represent what a given projection of light can look like on a substrate being treated. Variations in darkness of hatching patterns can represent light intensity, amplitude and/or frequency. Accordingly, point locations on a substrate surface receiving a full intensity of projected light can include the light or white areas in the illustration. Likewise, point locations with less whitespace can have a medium intensity or partial intensity of light being projected at those locations. Point locations shown as black squares in this illustration might receive no light or relatively little light exposure. Note that substrate signatures can vary in visual representation based on type of signature or non-uniformity. For example, CD signatures may appear as having some perceptible lines corresponding to scribe lanes, signatures. A substrate signature showing raster delay non-uniformities can show evidence of progression of a given stepper/scanner across a substrate surface. Substrate signatures for heat non-uniformity may have circular patterns or show differences at heat zone interfaces.

Figure 4:
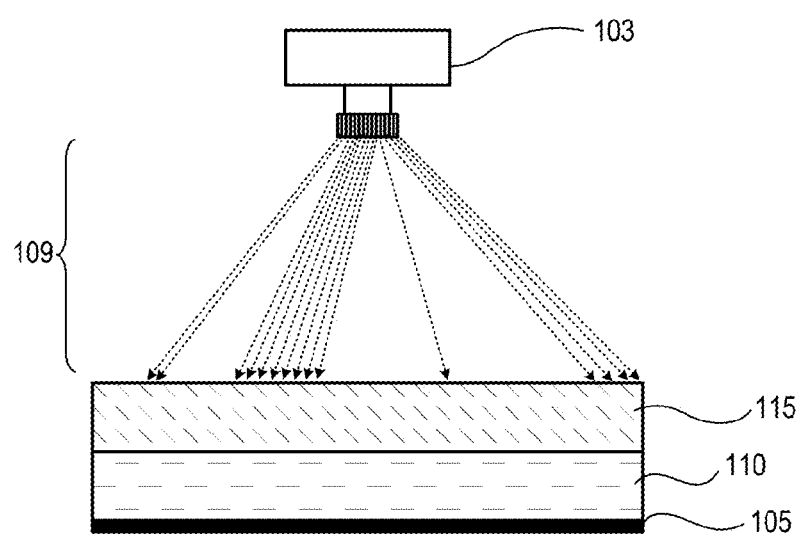
FIG. 4 is a schematic side view of an example image projection system for tuning a substrate.

FIG. 4 is similar to FIG. 1 and illustrates an example embodiment of an optical projection tuned substrate 105. Substrate 105 can include a film 115, which could be a photoresist film, as well as underlying layer 110, which may become a hardmask or other patterned layer or memorization layer for pattern transfer. The light projection device 103, or accompanying controller, can receive a pixel-based image to project on substrate 105. Projection of this pixel-based image is shown with projected imaged 109. Note that portions of the substrate 105 are irradiated while others are not. Instead of a mask-based light projection used for photolithographic exposures, a pixel-based image projection is used. During projection, the projected image can change or vary such as in response to real time feedback or other tuning objectives.

A particular image or video that is projected can be based on one or more sensors that can gather data either before a heating/treating process (static adjustment) or during a heating/treating process for dynamic adjustment. In a feedback loop, a given sensor or sensor array can collect data (such as a heat signature) and then send this collected data to a controller. The controller can then compute an image to project onto a substrate based on the collected data and/or based on whether it is heat or light correction that is needed. A proportional-integral-derivative controller (PID controller) can be used to implement heat signature feedback. The image projected can change based on any temperature oscillations across the substrate, such as center to edge oscillations.

Note that light intensity or amplitude can be adjusted based on a type of material on the surface of a substrate. For example, some polymers can have low reflectance, while other materials, such as silicon and metals, can have maximum reflectance values. In one specific example material, namely copper, reflectance can be 45% to 99%, but when light is incident on copper, the copper surface will heat up notwithstanding. Thus, techniques herein can be applied to most substrate materials.

Figure 2:
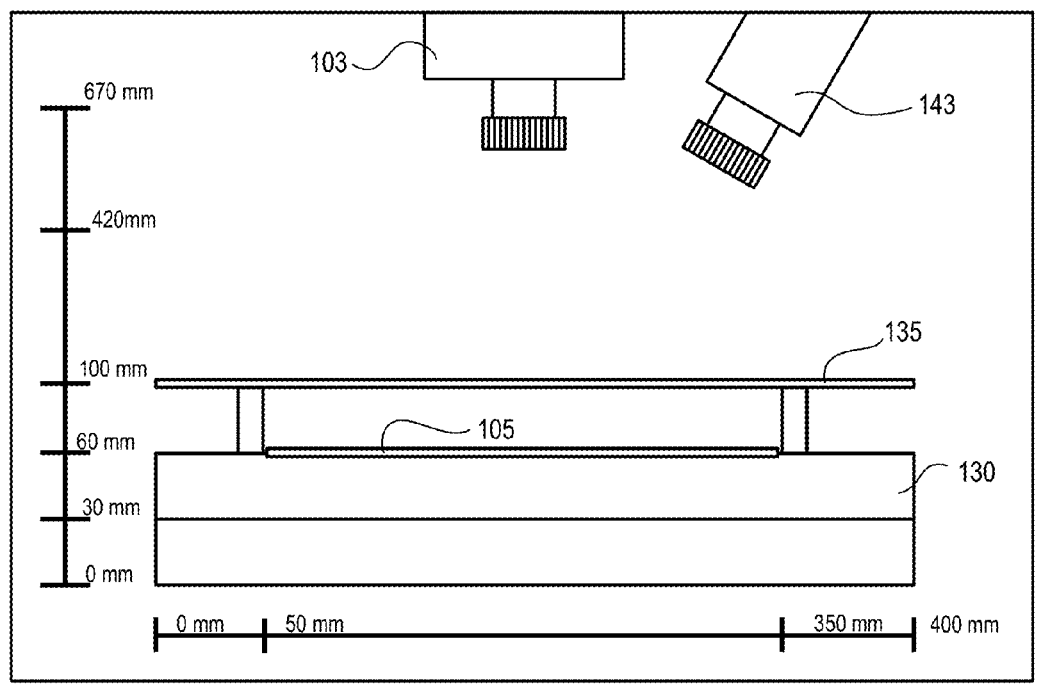
FIG. 2 is a schematic side view of an example image projection system for tuning a substrate.

FIG. 2 is a side-view diagram of an example system for improved substrate processing. A substrate 105 rests on a substrate holder 130, which can be embodied as, or include, a heat chuck. Various conventional technologies can be used for chuck-based heating including liquid circuits and heating zones. Above the substrate (facing a substrate side being treated) a DLP projector or the like can be positioned to project an image onto a substrate surface as part of light projection device 103. The location of the projector can vary based on space availability within a given chamber. For example, many heating modules of microfabrication tools are relatively short. In these embodiments, various apertures 135 and/or lens systems can be used to project an image within any limited vertical space above the substrate. Example height and width measurements are shown, but these are non-limiting and just to illustrate one particular embodiment.

Purpose-built light projection systems can be manufactured for use in such substrate tuning or heating modules. Alternatively, conventional DLP projectors can be used. For conventional DLP projector use, removing a color filter can increase light (heat) intensity available for projection on each substrate location. In many light projectors, white light generated by a light source passes through a color filter as the white light travels to the surface of a DLP chip. This means that most of the wavelengths are being absorbed before leaving the projector. In addition to removing any color filters, lamp intensity can also be increased according to particular design specifications.

Other embodiments can use different wavelength lamps for light projection on to a single substrate. These lamps can all contribute to light projection, or be selectively activated. Likewise, multiple projectors per hot plate can be used. In other embodiments, light projection can have a frequency-based output for finer tuning, such as with 3D graphics. In addition to an image-based light projector, a thermal imaging camera 143 can be positioned in view of the substrate 105 to identify a given heat signature in real time for dynamic adjustment of a heat signature based projected image. In another embodiment, a sensor array can be installed inside the hotplate and connected to a feedback loop of the PID controller.

Figure 8:
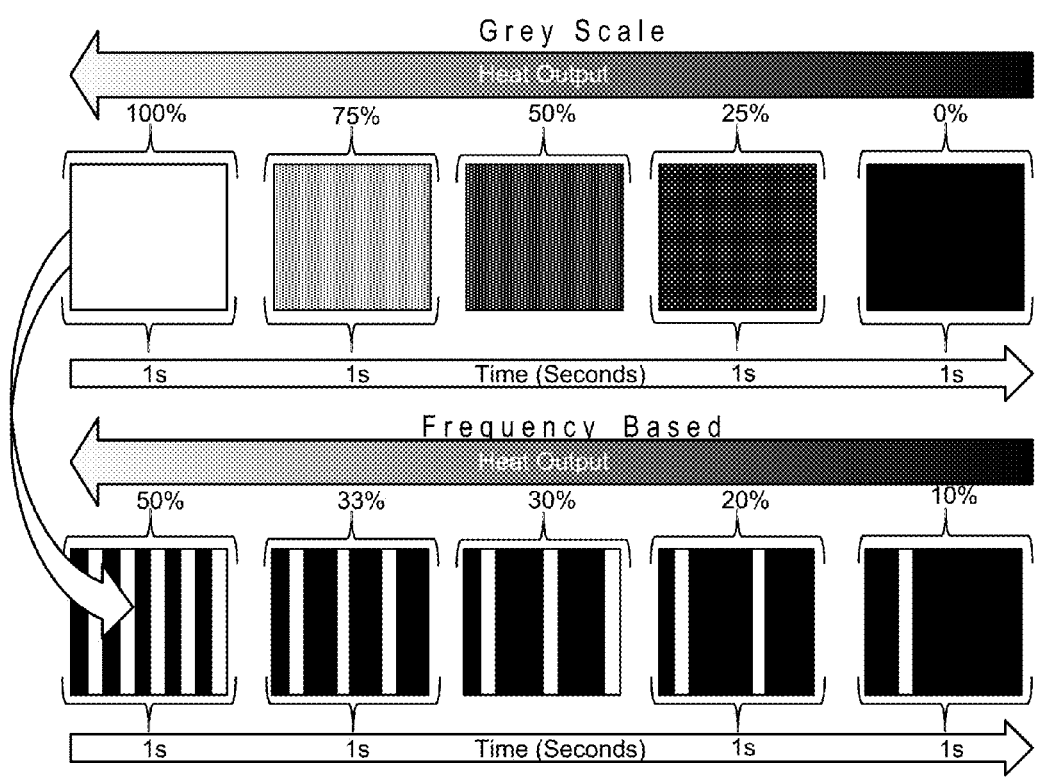
FIG. 8 is a diagram illustrating grey scale and frequency outputs available for tuning a substrate.

A given light image projected onto a substrate can be based on intensity (greyscale) and/or frequency (on and off). Available DLP mirrors can be switched on and off up to ten thousand times per second with over one thousand shades of grey. FIG. 8 illustrates how grey scale and frequency based light projection can be used to achieve a desired change in temperature at point locations on a substrate. Note that a temperature change potential is dependent on output or intensity of a given light source. With no light projected on a given spot there will be no change in surface temperature. With full light projected on the given spot there will be an increase in temperature that is 100% of the possible temperature change available based on a given lamp intensity and based on type of material being heated. A temperature change between 0% and 100% will typically be proportional to a grey scale intensity. Frequency-based light projection can cycle projection of full light intensity projection and no light projection. The shorter the interval between light projection on a given spot, the more a corresponding local temperature can be increased.

If finer control of light/heat projection is desired, then greyscale projection can be combined with frequency-based projection. For example, some conventional DLP chips can run at 1,700 Hz with 1,024 shades of grey. By combining greyscale and frequency-based projection, a total of 1,739,776 output levels per second can be produced.

Projecting a heat-signature based image onto a substrate positioned on a hotplate is just one embodiment of systems and methods herein. There are many additional applications and embodiments for treating substrates at various stages of semiconductor fabrication. Thus, applications are not limited to lithography. In another embodiment, the projected light-heat technique can be used during coating of a substrate (coating, for example, with a photo resist). Projecting an image onto a spinning substrate during coating of a liquid can help mitigate the evaporative cooling impact. The benefit is a lower dispense volume is needed while providing better coat uniformity. If there are non-transparent objects in a spin chamber that obstruct light projection, then light can at least be projected on a segment of the substrate, which would be essentially frequency-based projection because of the rotation of the substrate (this is for embodiments in which only a radial segment can be illuminated at a given point in time).

In other embodiments, light image projection can be used for both post application bake (PAB) and post exposure bake (PEB). Light image projection can be used for complex edge bead removal (EBR) clear outs—an area can be "drawn" or projected for edge bead removal. Light image projection can be used to define areas for directed self-assembly of block copolymers as a way to print an array. That is, exposure can be boosted sufficiently to where directed self-assembly (DSA) can print in an array, while remaining areas are not exposed so that the block copolymers will self-assemble without using a cut mask, which saves a process step in some microfabrication processes.

Embodiments can be used herein with wet or dry substrate cleaning systems. With wet cleaning systems, the projected light image can assist with center-to-edge temperature uniformity. In some processes in which a liquid is dispensed on a spinning substrate, a thickness of a film is greater toward the center of a substrate as compared to the edge. Techniques herein, however, can help even radial temperature uniformity. Depending on a location of dispense nozzles and dispense arms, an image that is projected in a dispense chamber may be essentially a partial image (e.g. pie-shaped image). Projecting onto only a portion of a substrate can nevertheless be effective especially with a spinning substrate because all of the surface can be irradiated or pass through a projected image. Projecting an image using UV light can further assist with reactivity of chemicals to improve radial reactivity of such chemicals as a spatial light augmentation technique that can be combined, for example, with a UV lamp directly providing most of the irradiation. Note that for UV light augmentation and projection, optics should be selected that enable UV transmission, such as quartz, calcium fluoride, or other transparent conducting media.

As should be apparent, there are many and various embodiments for systems and methods disclosed herein.

One embodiment includes a method of treating a substrate. This method includes positioning a substrate on a substrate holder. Positioning a substrate can include receiving the substrate in a module of a semiconductor fabrication tool. This semiconductor fabrication tool can include at least on module that dispenses photoresist on substrate. Such fabrication tools can include substrate handling mechanisms for automated moving of substrates among processing modules. Light is then projected onto a surface of the substrate via a grid-based light projection system configured to vary amplitude of projected light by location. Typical photolithographic light exposure is executed using a mask or reticle which blocks a portion of light so that a pattern of light reaches the substrate surface. In contrast, a grid-based light projection system projects light as an array or matrix of points, in which each projected point can be switched on or off and/or varied in frequency or amplitude. Projected light is then varied by amplitude on the surface of the substrate by location on the substrate with the variation being based a substrate signature. Projecting light onto the surface of the substrate can include projecting an image onto the substrate via a digital light processing (DLP) device. A particular projected image can be based on a predetermined energy signature corresponding to the substrate. Such an energy signature can include heat signature, light reflection signature, surface energy, x-rays, microwaves, etc. The image generated can be based on a predetermined critical dimension (CD) signature corresponding to the substrate, or a predetermined lithographic exposure signature corresponding to the substrate, which can be a result of raster delay or flare. Such signatures can compensate for raster scan/exposure delay and extreme ultraviolet (EUV) flare.

Treating the substrate can include heating the substrate using a heat source located below a top surface of the substrate, such as by using a hotplate. Thus, positioning the substrate can include receiving the substrate on a hotplate of a bake module of a semiconductor fabrication tool, which can be configured to bake resist material coated on the substrate and can also include conventional gas flow and exhausting components. A spatial heat signature of the surface of the substrate can then be identified using a thermal imaging device such as an infrared camera. A temperature-correction image is then calculated based on the heat signature. The temperature-correction image is then projected onto the surface of the substrate such that the temperature-correction image decreases an average temperature differential across the surface of the substrate. Accordingly, heating uniformity is significantly improved. The spatial heat signature can have spatial temperatures that vary from each other by up to approximately 0.1 degrees Celsius or more. Projecting the image onto the surface then causes the surface temperature variation to lower to less than about 0.02 degrees Celsius in difference. In alternative embodiments, treating the substrate can include identifying a spatial variation of a substrate property on the surface of the substrate, and then calculating a pixel-based image based on the identified spatial variation. Note that a given substrate signature can be identified from previous substrates having been processed by a particular tool, set of tools, and/or process sequence. In other words, substrate signatures can be calculated in real time for a substrate being processed, or calculated/observed from a repeating pattern of signatures for a given microfabrication process. Such a repeating pattern can be due to artifacts of a particular tool and/or material used. Substrate properties can include optical properties, electrical properties, mechanical properties, structure height, film thickness, temperature, etc.

In some embodiments, the digital light processing device is configured to project an image of independently addressable pixels onto the surface of the substrate. The digital light processing device can be configured to vary a light intensity of each independently addressable pixel. Light intensity can be varied by a DLP chip and/or light source. Some methods can include cooling a substrate using a heat sink located below a top surface of the substrate.

Another embodiment includes a method of treating a substrate. A substrate is positioned on a substrate holder within a processing chamber. A pixel-based image is projected onto a surface of the substrate via a digitally-controlled, micro-mirror projection device, with the pixel-based image being generated based on a substrate signature. The substrate can included a layer having photo-reactive agents such that the projected pixel-based image causes the photo-reactive agents to chemically react to the pixel-based image based on amplitude and/or wavelength of projected light at given point locations on the substrate. In other words, a pattern of projected light can assist with causing photo-reactive agents to generate acids, bases, or other solubility shifting materials. The substrate signature can correspond to a predetermined heat signature of temperatures on the substrate surface. Projecting the pixel-based image can include varying light intensity, duration, and wavelength by each projected pixel.

In another embodiment, a method of treating a substrate includes positioning a substrate on a substrate holder of a semiconductor fabrication tool. Heating the substrate on the substrate holder using a heating mechanism located within the substrate holder, and spatially adjusting a surface temperature of the substrate by projecting a pixel-based image onto the substrate using a digitally-controlled micro-mirror projection device. The pixel-based image varies light amplitude by individually addressable pixels, and the projected pixel-based image is based on a heat signature of the substrate.

Another embodiment includes a system or apparatus for treating substrates. This system includes a chamber sized and configured to receive a substrate for processing. A substrate holder is positioned within the chamber and configured to hold the substrate. The system includes an image projection system configured to project an image onto an upper surface (that is, a surface being processed) of the substrate when the substrate is in the chamber. The image projection system uses a micro-mirror projection device to project the image. A micro-mirror device can include a device with an array of microscopic mirrors corresponding to pixels in an image to be projected. The system includes a controller configured to control the image projection system and cause the image projection system to project a pixel-based image onto the upper surface of the substrate. The image projection system includes a light source and can use a pixel-based projection system. Each projected pixel can be varied by a parameter selected from the group consisting of light wavelength, light intensity, light frequency, and light amplitude. The image projection system can be configured to project an image based on a predetermined substrate signature, which can be a pixel-based representation of varying surface properties (heat, exposure dosages, critical dimension variations).

The processing system can also include a thermal imaging system positioned in view of the upper surface (surface being processed) of the substrate and configured to capture a pixel-based heat signature of the substrate. The image projection system can use a digital light processing (DLP) device or grating light valve (GLV) device to project the image onto the upper surface of the substrate. The system can include a dispense system configured to dispense liquid compositions on the surface of the substrate in a same processing chamber. The chamber can be positioned within a semiconductor fabrication tool that includes at least one module that dispenses liquid on a spinning substrate, and includes at least one module with a heating mechanism for heating a substrate. Such tools are sometimes known as coaters/developers. In another embodiment, the chamber is positioned within a semiconductor fabrication tool that includes at least one module configured to dispense photoresist on a substrate, at least one module configured to dispense developing chemicals on a substrate, and at least one module configured to bake a substrate. Other systems can be embodied as a scanner/stepper tool that includes a micro-mirror projection system or pixel-based projection system. Such an embodiment can be configured with a processing chamber being a separate module from a lithographic exposure stack, or located to project an image on a substrate surface during lithographic exposure.

Another embodiment includes a processing system for treating substrates. This processing system comprises a chamber sized and configured to receive a substrate for processing, and a hotplate positioned within the chamber. The hotplate comprises an upper surface configured to support a substrate and to transfer heat to the substrate. A gas injection system is configured for exposing the upper surface of the hotplate and/or substrate to an inert gas stream. A heater is configured for heating the hotplate. An image projection system is configured to project an image onto an upper surface of the substrate, the image projection system includes a micro-mirror projection device. The system also can include a controller configured for monitoring a temperature of the hotplate, controlling the gas injection system, controlling the heater, and controlling the image projection system. The image projection system can use a pixel-based projection system, and can include a light source. Each projected pixel can be varied in at least one of light intensity, light frequency, and light amplitude. A given image can be projected as a grid of points of light. Intensity of each projected pixel can be based on a spatial heat signature of the substrate. In some embodiments, the image projection system uses a digital light processing (DLP) device or a grating light valve (GLV) device to project the image onto the upper surface of the substrate. Optionally, a thermal imaging system can be positioned in view of the upper surface of the substrate and configured to identify a grid-based temperature of the substrate. Hotplates can include multiple heating zones for backside heating of the substrate. The image projection system can include a light filtration system configured to exclude specific wavelengths of light from being projected onto the upper surface of the substrate.

In another embodiment, the processing system includes a chamber sized and configured to receive a substrate for processing, a cold-plate comprising an upper surface configured to support a substrate and to remove heat from the substrate. A heat sink is configured for cooling the cold-plate, and an image projection system is configured to project an image onto an upper surface of the substrate. The image projection system includes a micro-mirror projection device. A controller is configured for monitoring a temperature of the cold-plate, controlling the heat sink, and controlling the image projection system.

Another embodiment includes receiving a substrate having a film used with directed self-assembly of block copolymers. An image is projected onto the substrate film using digital light projection such that the image modifies the film according to a spatially-projected image. A film of block copolymers is applied, and self-assembly is activated or initiated such that copolymers assemble into a pattern based on the spatially-projected (pixel-based) image.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of treating a substrate, the method comprising:
    positioning a substrate on a substrate holder;
    heating the substrate using a heat source located below a top surface of the substrate;
    projecting light onto a surface of the substrate via a grid-based light projection system configured to vary amplitude of projected light by location;
    varying amplitude of light projected on the surface of the substrate by location based on a substrate signature;
    identifying a spatial heat signature of the surface of the substrate using a thermal imaging device;
    calculating a temperature-correction image based on the spatial heat signature; and
    projecting the temperature-correction image onto the surface of the substrate such that the temperature-correction image decreases an average temperature differential across the surface of the substrate.

2. The method of claim 1, wherein the spatial heat signature has spatial temperatures that vary from each other by up to approximately 0.1 degrees Celsius, and wherein projecting the temperature-correction image onto the surface of the substrate causes the spatial temperatures to vary from each other by less than about 0.02 degrees Celsius.

3. A method of treating a substrate, the method comprising:
    positioning a substrate on a substrate holder of a semiconductor fabrication tool;
    heating the substrate on the substrate holder using a heating mechanism located within the substrate holder; and
    spatially adjusting a surface temperature of the substrate by projecting a pixel-based image onto the substrate using a digitally-controlled micro-mirror projection device, wherein the pixel-based image varies light amplitude by individually addressable pixels, the projected pixel-based image being based on a heat signature of the substrate.

4. A method of treating a substrate, the method comprising:
    positioning a substrate on a substrate holder;
    heating the substrate using a heat source located below a top surface of the substrate;
    identifying a spatial heat signature of a surface of the substrate using a spatial temperature sensor;
    calculating a temperature-correction image based on the spatial heat signature; and
    projecting the temperature-correction image onto the surface of the substrate such that the temperature-correction image decreases an average temperature differential across the surface of the substrate, wherein the temperature-correction image is projected via a grid-based light projection system configured to vary amplitude of projected light by location, the temperature-correction image that is projected resulting in light varying in amplitude by location on the substrate based on the spatial heat signature.

5. The method of claim 4, wherein the spatial heat signature has spatial temperatures that vary from each other by up to approximately 0.1 degrees Celsius, and wherein projecting the temperature-correction image onto the surface of the substrate causes the spatial temperatures to vary from each other by less than about 0.02 degrees Celsius.

6. A method of treating a substrate, the method comprising:
    positioning a substrate on a substrate holder;
    heating the substrate using a heat source located below a top surface of the substrate;
    identifying a substrate signature of a surface of the substrate;
    calculating a temperature-adjustment image based on the substrate signature;
    projecting the temperature-adjustment image onto the surface of the substrate such that the temperature-adjustment image modifies substrate temperatures at point locations across the surface of the substrate based on the substrate signature, the temperature-adjustment image being projected as a pixel-based image having variations in light amplitude by projected location, the temperature-adjustment image being projected using a digitally-controlled projection device configured to vary amplitude of projected light by individually addressable pixels.

7. The method of claim 6, wherein projecting the temperature-adjustment image onto the surface of the substrate as the pixel-based image includes the digitally-controlled projection device projecting the temperature-adjustment image via a progressive scan.

8. The method of claim 6, wherein positioning the substrate on the substrate holder includes positioning the substrate within an etching system.

9. The method of claim 8, wherein the etching system is a dry etch system with vacuum processing.

10. The method of claim 6, wherein positioning the substrate on the substrate holder includes positioning the substrate within a semiconductor fabrication tool that includes at least one coater-developer module.

* * * * *